(12) United States Patent
Rhodes

(10) Patent No.: US 6,756,616 B2
(45) Date of Patent: Jun. 29, 2004

(54) CMOS IMAGER AND METHOD OF FORMATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,546

(22) Filed: Aug. 30, 2001

(65) Prior Publication Data

US 2003/0042511 A1 Mar. 6, 2003

(51) Int. Cl.[7] .................. H01L 31/062; H01L 31/0203; H01L 21/00; H01L 27/00
(52) U.S. Cl. ............... 257/291; 257/185; 257/232; 257/431; 257/432; 257/440; 257/461; 438/48; 438/57; 438/59; 250/208.1; 250/214.1; 250/226
(58) Field of Search ................. 257/291, 292, 257/185, 232, 431, 432, 440, 458, 461, 463, 655, 917; 438/48, 57, 59, 70, 91, 141, 232, 237, 328; 250/214.1, 226, 338.4, 208.1

(56) References Cited

U.S. PATENT DOCUMENTS

| 3,860,956 | A | * | 1/1975 | Kubo et al. ............... 358/48 |
| 5,945,722 | A | * | 8/1999 | Tsuei et al. ............... 257/440 |
| 5,965,875 | A | | 10/1999 | Merrill |
| 6,066,510 | A | | 5/2000 | Merrill |
| 6,150,683 | A | * | 11/2000 | Merrill et al. ............... 257/292 |
| 6,330,113 | B1 | | 12/2001 | Slagle et al. |
| 2002/0058353 | A1 | | 5/2002 | Merrill |

* cited by examiner

Primary Examiner—Donghee Kang
(74) Attorney, Agent, or Firm—Dickstein Shapiro Morin & Oshinsky LLP

(57) ABSTRACT

A CMOS imager having multiple graded doped regions formed below respective pixel sensor cells is disclosed. A deep retrograde p-well is formed under a red pixel sensor cell of a semiconductor substrate to increase the red response. A shallow p-well is formed under the blue pixel sensor cell to decrease the red and green responses, while a shallow retrograde p-well is formed below the green pixel sensor cell to increase the green response and decrease the red response.

110 Claims, 9 Drawing Sheets

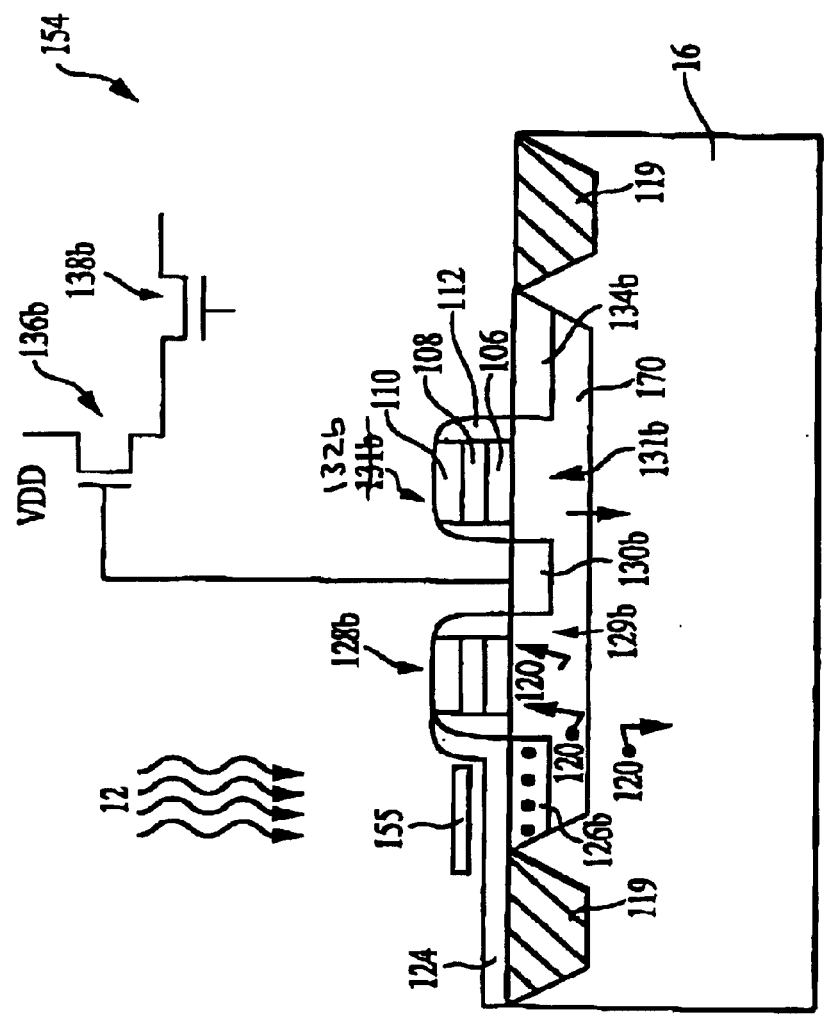

CMOS IMAGER AND METHOD OF FORMATION

FIELD OF THE INVENTION

The present invention relates to improved semiconductor imaging devices and, in particular, to CMOS imagers with improved color separation and sensitivity.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

CCD technology is often used for image acquisition and has a number of advantages which makes it the preferred technology, particularly for small size imaging applications. CCDs are capable of large formats with small pixel size and they employ low noise charge domain processing techniques. CCD imagers suffer, however, from a number of disadvantages. For example, they are susceptible to radiation damage, they exhibit destructive read-out over time, they require good light shielding to avoid image smear and they have a high power dissipation for large arrays. In addition, while offering high performance, CCD arrays are difficult to integrate with CMOS processing in part due to a different processing technology and to their high capacitances, complicating the integration of on-chip drive and signal processing electronics with the CCD array. Further, CCDs may suffer from incomplete charge transfer from pixel to pixel which results in image smear.

Because of the inherent limitations in CCD technology, CMOS imagers have been increasingly used as low cost imaging devices. A filly compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

CMOS imagers have several advantages over CCD imagers, such as, for example, low voltage operation and low power consumption, compatibility with integrated on-chip electronics (control logic and timing, image processing, and signal conditioning such as A/D conversion), random access to the image data, and lower fabrication costs. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a doped region of a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the charge accumulation region of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

A schematic view of an exemplary CMOS imaging circuit is illustrated in FIG. 1. As it will be described below, the CMOS imaging circuit includes a photogate for accumulating photo-generated charge in an underlying portion of the substrate. It should be understood, however, that the CMOS imager may include a photodiode or other image to charge converting device, in lieu of a photogate, as the initial accumulator for photo-generated charge.

FIG. 1 shows a simplified photodetector circuit for a pixel cell 14 of an exemplary CMOS imager using a photogate and and a readout circuit 60. It should be understood that while FIG. 1 shows the circuitry for operation of a single pixel, in practical use there will be an M×N array of pixels arranged in rows and columns with the pixels of the array accessed using row and column select circuitry, as described in more detail below.

The pixel cell 14 is shown in part as a cross-sectional view of a semiconductor substrate 16, which is typically a p-type silicon, having a surface well of p-type material 20. An optional layer 18 of p-type material may be used, if desired. Substrate 16 may be formed of Si, SiGe, Ge, or GaAs, among others. Typically, the entire semiconductor substrate 16 is a p-type doped silicon substrate including a surface p-well 20 (with layer 18 omitted), but many other options are possible, such as, for example p on p– substrates, p on p+ substrates, p-wells in n-type substrates or the like.

An insulating layer 22 of silicon dioxide, for example, is formed on the upper surface of p-well 20. The p-type layer may be a p-well formed in substrate 16. A photogate 24, thin enough to pass radiant energy or of a material which passes radiant energy, is formed on the insulating layer 22. The photogate 24 receives an applied control signal PG which causes the initial accumulation of pixel charges in n+ region 26. An n+ type region 26, adjacent to one side of the photogate 24, is formed in the upper surface of p-well 20. A transfer gate 28 is formed on insulating layer 22 between the n+ type region 26 and a second n+ type region 30 formed in p-well 20. The n+regions 26 and 30 and transfer gate 28 form a charge transfer transistor 29 which is controlled by a transfer signal TX. The n+ region 30 is typically called a floating diffusion region. The n+ region 30 is also a node for passing charge accumulated thereat to the gate of a source follower transistor 36 described below.

A reset gate 32 is also formed on insulating layer 22 adjacent and between the n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, of for example, 5 volts. The transfer and reset transistors 29, 31 are n-channel transistors as described in this implementation of a CMOS imager circuit in a p-well. As known in the art, it is also possible to implement a CMOS imager in an n-well, in which case each of the transistors would be p-channel transistors. It should also be noted that, while FIG. 1 shows the use of a transfer gate 28 and associated transistor 29, this structure provides advantages, but is not required.

Pixel cell 14 also includes two additional n-channel transistors, a source follower transistor 36 and a row select transistor 38. Transistors 36, 38 are coupled in series, source to drain, with the source of transistor 36 also coupled over lead 40 to voltage source $V_{DD}$ and the drain of transistor 38 coupled to a lead 42. The drain of the row select transistor 38 is connected via conductor 42 to the drains of similar row select transistors for other pixels in a given pixel row. A load transistor 39 is also coupled between the drain of transistor 38 and a voltage source $V_{SS}$, of for example 0 volts. Transistor 39 is kept on by a signal $V_{LN}$ applied to its gate.

The imager includes a readout circuit 60 (FIG. 1) which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by the reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in a manner similar to that of pixel cell 14 of FIG. 1. Pixel array 200 comprises a plurality of pixels arranged in a predetermined number of columns and rows. The pixels of each row in array 200 are all turned on at the same time by a row select line, such as line 86, and the pixels of each column are selectively output by a column select line, such as line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of pixel cell 14 of the CMOS imager of FIG. 1. The photogate signal PG is nominally set to 5V and pulsed from 5V to 0V during integration. The reset signal RST is nominally set at 2.5V. As illustrated in FIG. 3, the process begins at time $t_0$ by briefly pulsing reset voltage RST to 5V. The RST voltage, which is applied to the gate 32 of the reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}-V_{TH}$). The charge on the floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72, which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that, for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

For black and white imaging, each pixel cell 14 (FIG. 1) represents a pixel of light energy. Color imaging, however, requires three pixel cells 14 for the formation of a single color pixel. For example, a conventional color pixel sensor 50 is illustrated in FIG. 4 as including a red active pixel sensor cell 52, a blue active pixel sensor cell 54 and a green active pixel sensor cell 56, spaced apart on the semiconductor substrate 16 by isolation regions 19. Each of the red, blue and green active pixel sensor cells 52, 54, 56 have respective red, blue and green filters 53, 55, 57, which allow only red, blue and green photons, respectively, to pass through. Thus, the red, blue and green active pixel sensor cells 52, 54, 56 operate in a similar way to the pixel cell 14 (FIG. 1), except that the information provided by each of the red, blue and green active pixel sensor cells 52, 54, 56 is limited by the intensities of the red, blue and green light, respectively.

One of the drawbacks of using a color pixel sensor, such as the color pixel sensor 50 of FIG. 4, is that the minority carriers in the blue active pixel sensor cell 54, for example, are substantially more likely to be lost in recombination than the minority carriers formed in the red and green active pixel sensor cells 52, 56. The difference in the recombination rates is due to the relatively shallow penetration depths of the blue photons, the higher majority carrier concentration that exists in the n+ region 30 than in the substrate 16, and the depth of the junction. For example, even though the average penetration of a blue photon in a CMOS photodiode is approximately $0.2\mu$, a large number of blue photons fail to penetrate beyond the $0.1\mu$ junction. This way, a large amount of these photons are lost to recombinations and the blue cell response remains substantially below the red cell and green cell responses.

One technique for equalizing the red, blue and green responses is to increase the amplification provided by the column sense amplifier that corresponds to the blue active pixel sensor cell 54. For example, if the blue response is "n" times lower that the red and green responses, equalized red, blue and green responses are obtained if the column sense amplifiers corresponding to the blue active pixel sensor cell 54 are set to provide a gain of "n" times. This technique, however, introduces noise by the charge-to-voltage conversion process, as well as by the sense amplifiers themselves. Thus, along with the blue signal, the noise also increases "n" times.

There is needed, therefore, an improved pixel sensor cell for use in an imager that exhibits improved color separation, a better signal-to-noise ratio, and reduced cross talk. A method of fabricating a pixel sensor cell exhibiting these improvements is also needed.

SUMMARY OF THE INVENTION

The present invention provides multiple graded doped regions formed below respective pixel sensor cells of a CMOS imager. In an exemplary embodiment, a deep retrograde p-well is formed under a red pixel sensor cell of a semiconductor substrate to increase the red response. A shallow p-well is formed under the blue pixel sensor cell to decrease the red and green responses, while a shallow retrograde p-well is formed below the green pixel sensor cell to increase the green response and decrease the red response. Each of the multiple graded doped regions would have an entire array of respective pixels formed therein, and may also have peripheral circuitry formed therein. If the peripheral circuitry is formed in the multiple graded doped regions, the multiple graded doped regions may have a different dopant profile in the peripheral region than in the array region.

Also provided are methods for forming a color pixel cell having multiple graded doped regions of the present invention.

Additional advantages and features of the present invention will be apparent from the following detailed description and drawings which illustrate preferred embodiments of the invention.

BRIEF DESCRIPTION OF THE DRAWINGS

FIG. 14 is a cross-sectional view of the middle portion of the color pixel of FIG. 12.

DETAILED DESCRIPTION OF PREFERRED EMBODIMENTS

Figure 1:
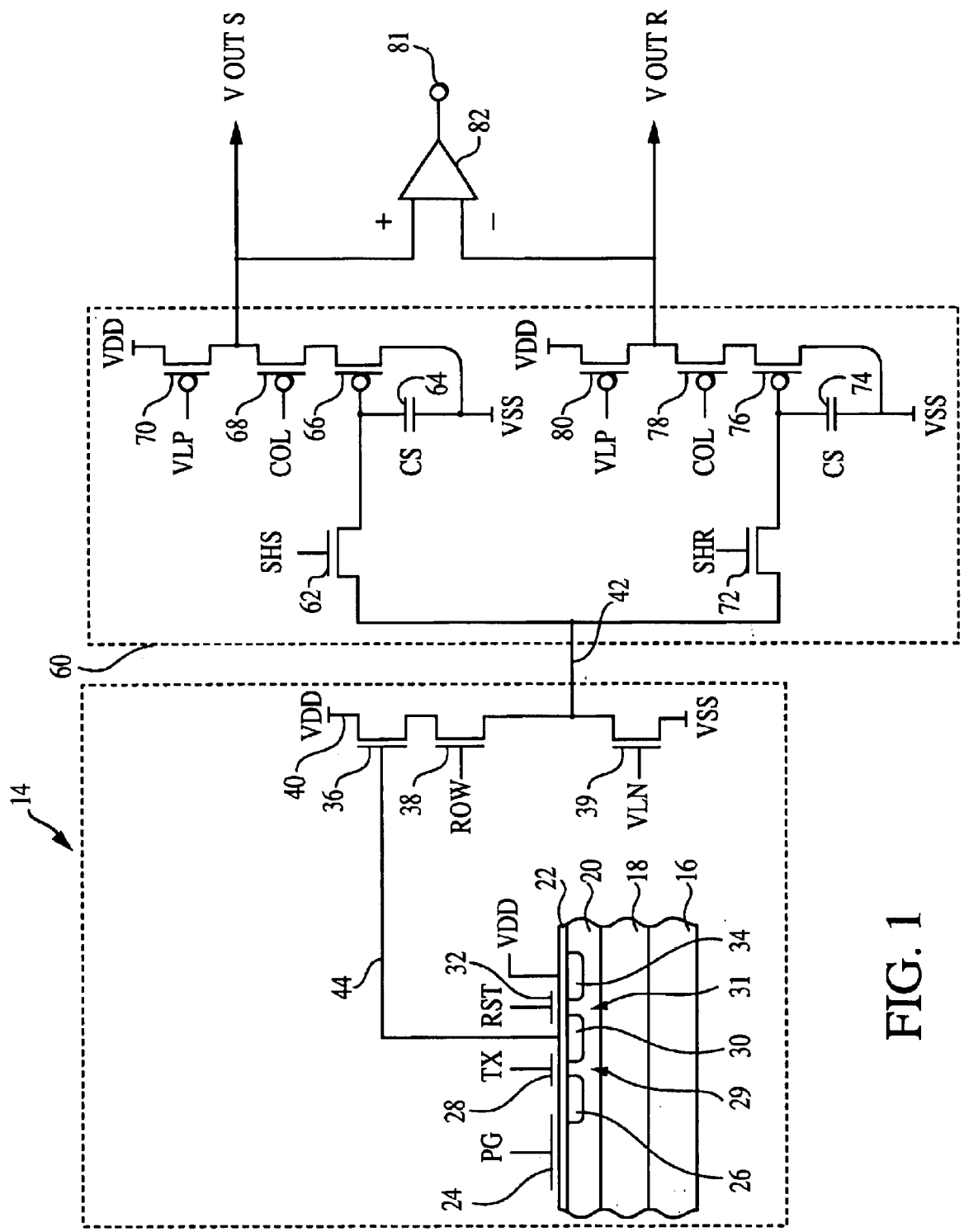
FIG. 1 is a representative circuit of a active pixel cell of a CMOS imaging system.
Figure 2:
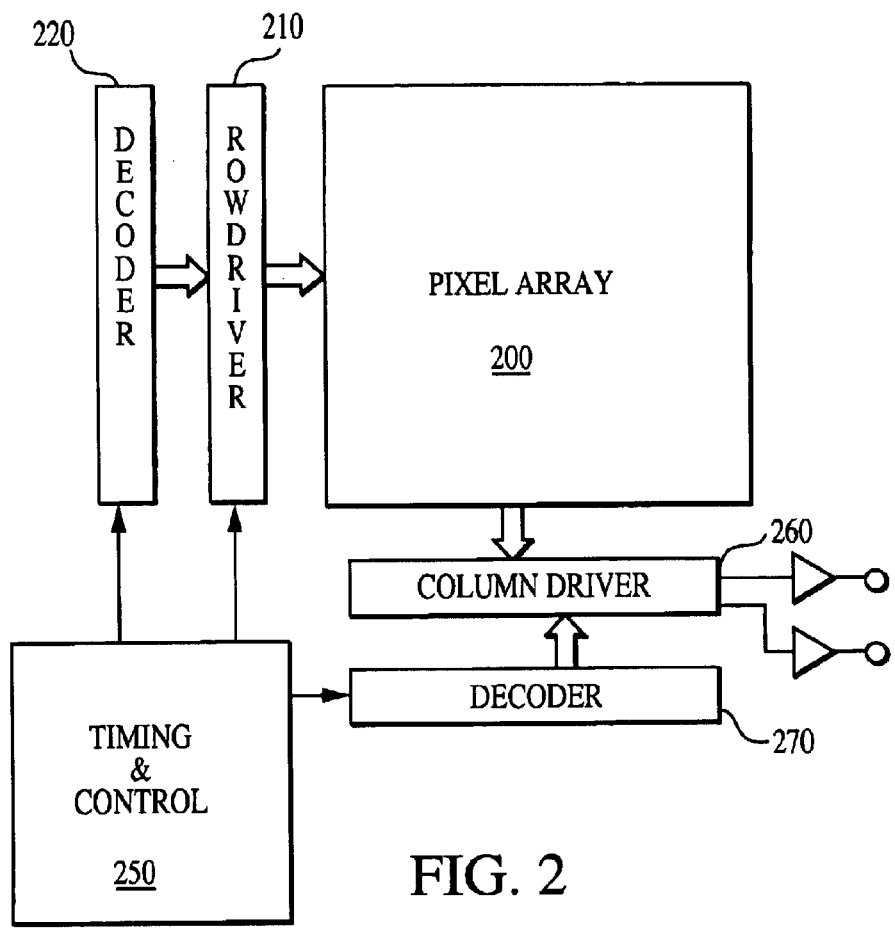
FIG. 2 is a block diagram of a CMOS pixel sensor chip.
Figure 3:
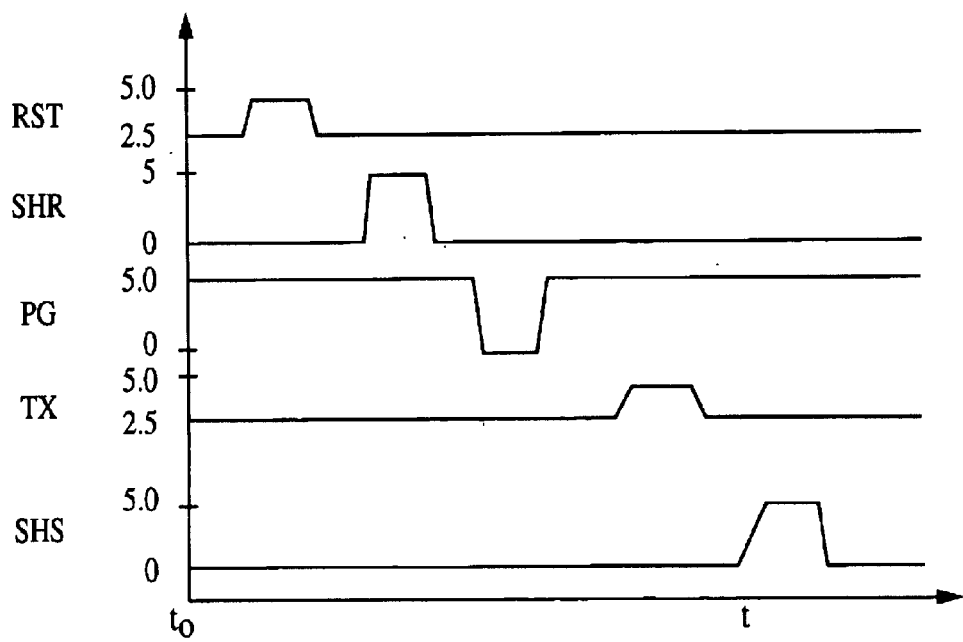
FIG. 3 is a representative timing diagram of a CMOS imager.
Figure 4:
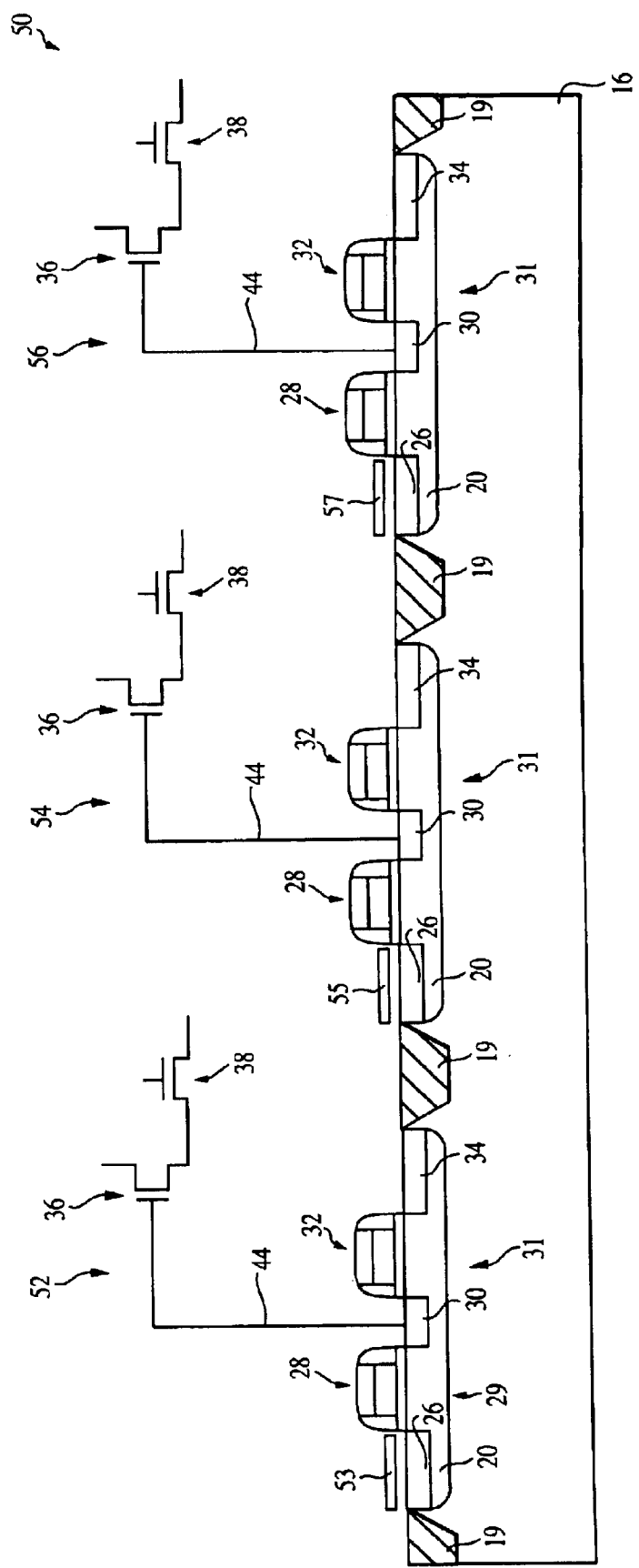
FIG. 4 is a cross-sectional and schematic view of a color pixel.
Figure 5:
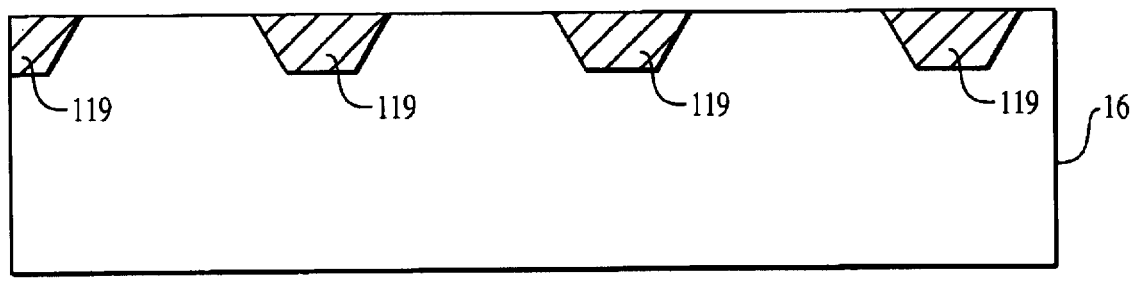
FIG. 5 is a cross-sectional and schematic view of a color pixel fabricated in accordance with a first embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. For exemplary purposes an imager formed of n-channel devices in a retrograde p-well is illustrated and described, but it should be understood that the invention is not limited thereto, and may include other combinations such as an imager formed of p-channel devices in a retrograde n-well.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

The term "retrograde well" refers to a doped region in a substrate where the peak concentration of the dopant is lower than that of the electrically active surface region of any device which may be eventually formed in the well.

Referring now to the drawings, where like elements are designated by like reference numerals, FIGS. 5–14 illustrate an exemplary embodiment of a method of forming a color pixel cell group 100 (FIG. 12) having respective multiple graded doped regions, such as doped regions 160, 170 and 180. The FIG. 5 structure depicts a portion of a semiconductor substrate 16 having isolation regions 119, which may be field oxide regions (FOX), for example, and which have been already formed according to conventional semiconductor processing techniques. For example, the isolation regions 119 may be formed by thermal oxidation of the underlying substrate material in a LOCOS process, or by etching trenches and filling them with oxide in an STI process, among others.

Figure 6:
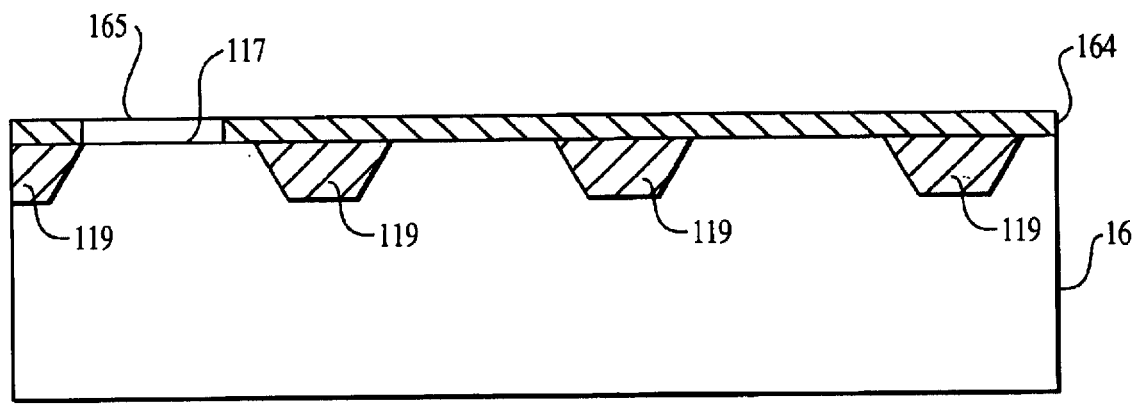
FIG. 6 is a cross-sectional view of the color pixel of FIG. 4 at a stage of processing subsequent to that shown in FIG. 5.
Figure 7:
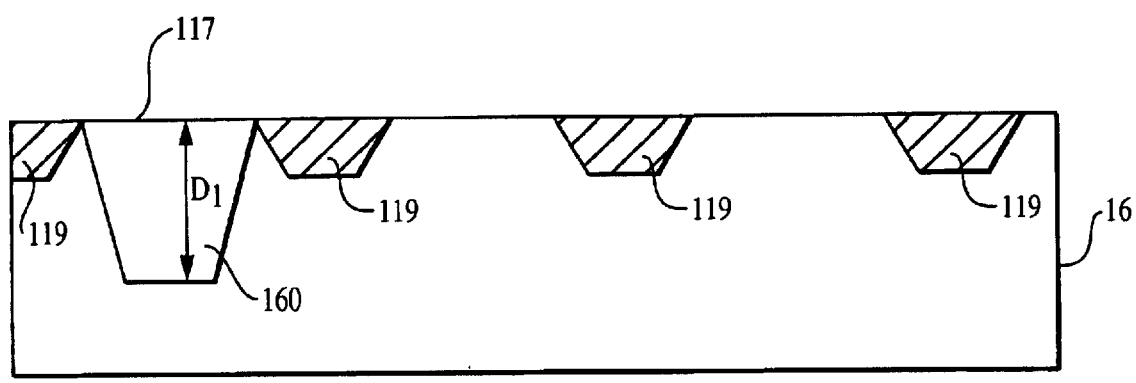
FIG. 7 is a cross-sectional view of the color pixel of FIG. 4 at a stage of processing subsequent to that shown in FIG. 6.

Next, as shown in FIGS. 6–7, a first doped region 160 for a red pixel cell is formed in the semiconductor substrate 16. In an exemplary embodiment of the present invention, the first doped region 160 is a deep well, advantageously being a retrograde well, having a first conductivity type, which for exemplary purposes is treated as a p-type. For this, the semiconductor substrate 16 is patterned with a first pattern layer 164 (FIG. 6), preferably a photoresist mask, to create an area 165 on the substrate surface 117 of the semiconductor substrate 16, which will allow a first dopant implantation and the formation of the deep retrograde p-well 160 (FIG. 7). With the first pattern layer 164 as a mask, p-type impurity dopants such as boron, for example, are implanted in the area 165 of the semiconductor substrate 16. The p-type dopant atoms are implanted in the semiconductor substrate 16 using conventional implantation apparatus, such as ion implantation apparatus, and by known methods to one of ordinary skill in the art.

The deep retrograde p-well 160 (FIG. 7) is formed at a depth $D_1$ of about 1 micron to about 8 microns, more preferably of about 2 micron to about 6 microns, from a substrate surface 117. The depth $D_1$ may be adjusted, however, according to the device characteristics, so that the electron-hole pairs corresponding to a red color pixel cell 152 (FIG. 12) are contained within the perimeter of the deep retrograde p-well 160.

Figure 12:
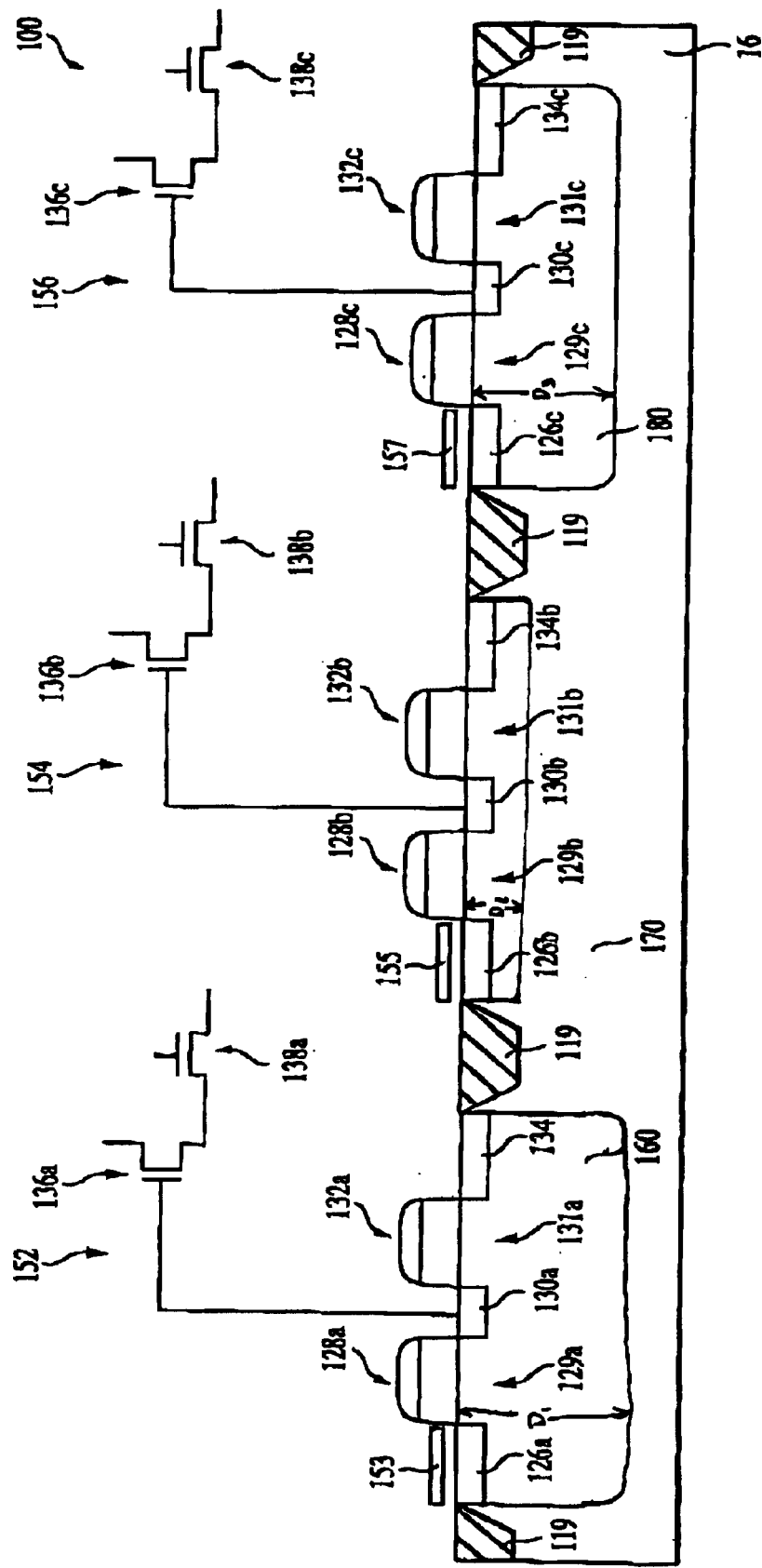
FIG. 12 is a cross-sectional view of the color pixel of FIG. 4 at a stage of processing subsequent to that shown in FIG. 11.
Figure 13A:
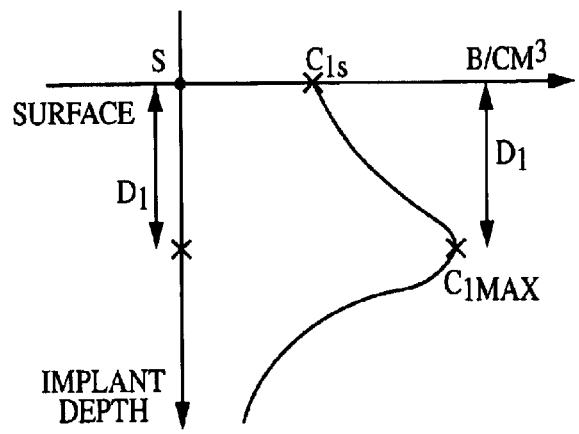
FIGS. 13a–13c illustrate the dopant concentration as a function of surface depth for each of the wells of the color pixel of FIG. 12.

To better illustrate the characteristics of the deep retrograde p-well 160, reference is now made to FIG. 13a, which depicts the concentration of boron (B) atoms per cubic centimeter ($cm^3$) of the deep retrograde p-well 160 as a function of the implantation depth. As shown in FIG. 13a, the deep retrograde p-well 160 has a vertically graded dopant concentration that is lower at the substrate surface 117, and highest at the bottom of the well. The dopant concentration $C_1s$ (FIG. 13a) at the top of the deep retrograde p-well 160, that is at the surface level S (FIG. 13a), is within the range of about $5 \times 10^{14}$ to about $1 \times 10^{18}$ atoms per $cm^3$, and is preferably within the range of about $1 \times 10^{16}$ to about $1 \times 10^{17}$ atoms per $cm^3$, and most preferably is about $4 \times 10^{16}$ atoms per $cm^3$. At the bottom of the deep retrograde p-well 60, that is, at depth $D_1$ (FIG. 13a), the dopant concentration $C_1max$ (FIG. 13a) is within the range of about $1 \times 10^{16}$ to about $2 \times 10^{18}$ atoms per $cm^3$, and is preferably within the range of about $4 \times 10^{16}$ to about $1 \times 10^{18}$ atoms per $cm^3$, and most preferably is about $1 \times 10^{17}$ atoms per $cm^3$. The single deep retrograde p-well 60 spans only red pixel cell 152 (FIG. 12) of the color pixel cell 100 (FIG. 12).

Figure 8:
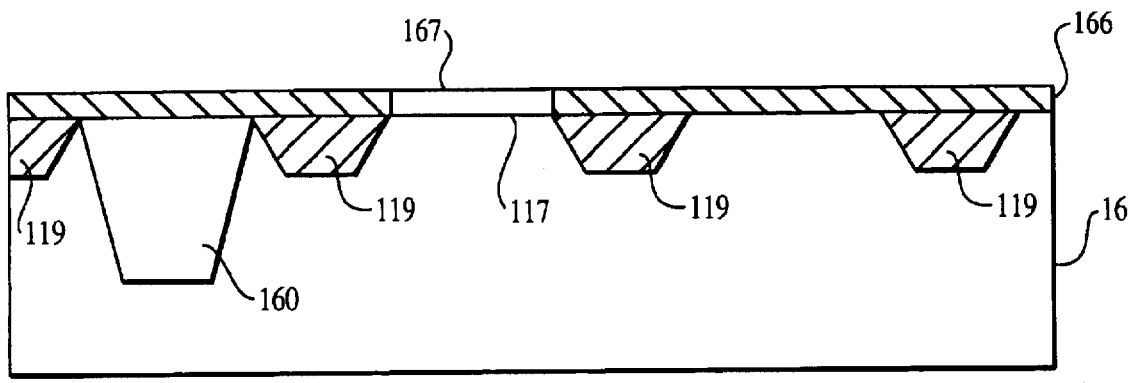
FIG. 8 is a cross-sectional view of the color pixel of FIG. 4 at a stage of processing subsequent to that shown in FIG. 7.
Figure 9:
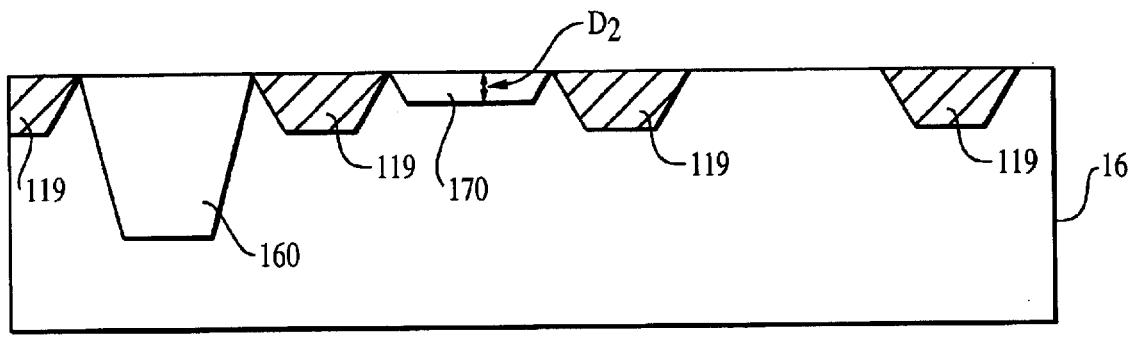
FIG. 9 is a cross-sectional view of the color pixel of FIG. 4 at a stage of processing subsequent to that shown in FIG. 8.

Referring now to FIGS. 8–9, a second doped region 170 for a blue pixel cell is next formed in the semiconductor substrate 16, lateral to the first doped region 160 and below and adjacent to the substrate surface 117. In an exemplary embodiment of the invention, this second doped region 170 is a shallow p-well 170 (FIG. 9) which may be formed by a similar or different technique as that for the formation of the deep retrograde p-well 160 (FIG. 7). As shown in FIG. 8, the semiconductor substrate 16 is patterned with a second pattern layer 166, preferably a photoresist mask, to create an area 167 (FIG. 8) on the substrate surface 117 of the substrate 16, to further allow a second dopant implantation and the formation of the shallow p-well 170 (FIG. 9). With the second pattern layer 166 as a mask, p-type impurity dopants such as boron, for example, are implanted in the area 167 of the semiconductor substrate 16. The p-type dopant atoms are implanted in the semiconductor substrate 16 using conventional implantation apparatus, such as ion implantation apparatus, and by known methods to one of ordinary skill in the art.

The shallow p-well 170 (FIG. 9) is formed at a depth $D_2$ of about 0.1 micron to about 0.5 microns, more preferably of about 0.1 micron to about 0.25 microns, from the substrate surface 117. The depth $D_2$ may be adjusted, however, according to the device characteristics, so that the electron-hole pairs corresponding to a blue pixel cell 154 (FIG. 12) are contained within the perimeter of the shallow p-well 170.

Figure 13B:
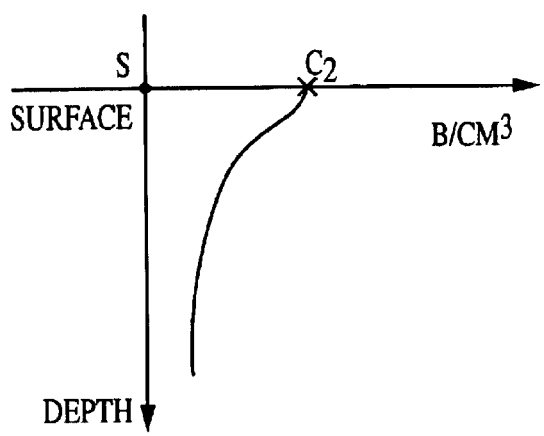

To better illustrate the characteristics of the shallow p-well 170, reference is now made to FIG. 13b, which depicts the concentration of boron (B) atoms per surface area of the shallow p-well 170 as a function of the implantation depth. As shown in FIG. 13b, the dopant concentration $C_2$ at the top of the shallow p-well 170, that is at the surface level S (FIG. 13b), is within the range of about $5 \times 10^{14}$ to about $1 \times 10^{18}$ atoms per $cm^3$, and is preferably within the range of about $1 \times 10^{16}$ to about $1 \times 10^{17}$ atoms per $cm^3$, and most preferably is about $4 \times 10^{16}$ atoms per $cm^3$. In any event, the single shallow p-well 170 spans only blue pixel cell 154 (FIG. 12) of the color pixel cell 100, as depicted in FIG. 12.

Figure 10:
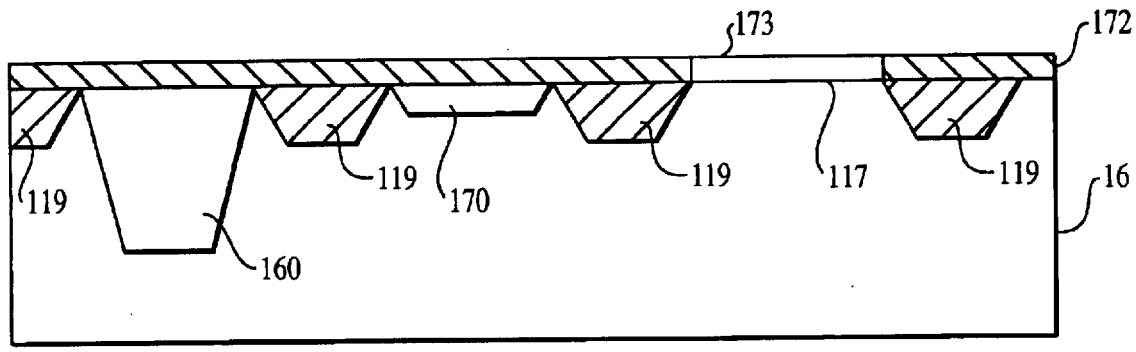
FIG. 10 is a cross-sectional view of the color pixel of FIG. 4 at a stage of processing subsequent to that shown in FIG. 9.
Figure 11:
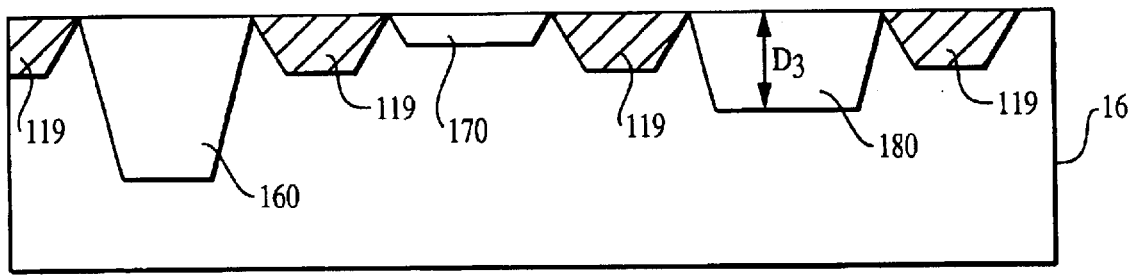
FIG. 11 is a cross-sectional view of the color pixel of FIG. 4 at a stage of processing subsequent to that shown in FIG. 10.

Referring now back to FIGS. 10–11, a third doped region 180 (FIG. 11) for a green pixel cell is formed in the semiconductor substrate 16, lateral to the first and second doped regions 160, 170 and at a depth $D_3$ (FIG. 11) below the substrate surface 117. In an exemplary embodiment of the invention, this third doped region 180 is a shallow retrograde p-well 180 (FIG. 11). The shallow retrograde p-well 180 may be also formed by similar or different techniques to those used for the formation of the first deep retrograde p-well 160 and the second shallow p-well 170.

The shallow retrograde p-well 180 is formed at a depth $D_3$ of about 0.5 micron to about 3 microns, more preferably of about 0.5 microns to about 2.0 microns, from the substrate surface 117. The depth $D_3$ may be adjusted, however, according to the device characteristics, so that the electron-hole pairs corresponding to a green pixel cell 156 (FIG. 12) are contained within the perimeter of the shallow retrograde p-well 180. In any event, the depth $D_1$, corresponding to the deep retrograde p-well 160, is substantially greater than the depth $D_3$, corresponding to the shallow retrograde p-well 180.

The semiconductor substrate 16 is patterned with a third pattern layer 172, preferably a photoresist mask, to create an area 173 (FIG. 10) on the substrate surface 117 of the semiconductor substrate 16, to allow a third dopant implantation and the formation of the shallow retrograde p-well 180 (FIG. 11). With the second pattern layer 166 as a mask, p-type impurity dopants such as boron, for example, are implanted in the area 167 of the semiconductor substrate 16. The p-type dopant atoms are implanted in the semiconductor substrate 16 using conventional implantation apparatus, such as ion implantation apparatus, and by known methods to one of ordinary skill in the art.

Figure 13C:
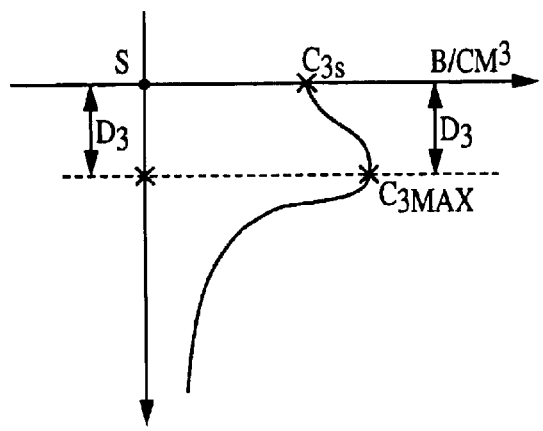

To better illustrate the characteristics of the shallow retrograde p-well 180, reference is now made to FIG. 13c, which depicts the concentration of boron (B) atoms per surface area of the shallow retrograde p-well 180 as a function of the implantation depth. As shown in FIG. 13c, the shallow retrograde p-well 180 has a vertically graded dopant concentration that is lowest at the substrate surface 117, and highest at the bottom of the well. The dopant concentration $C_3s$ (FIG. 13c) at the top of the shallow retrograde p-well 180, that is at the surface level S (FIG. 13c), is within the range of about $5\times10^{14}$ to about $1\times10^{18}$ atoms per cm$^3$, and is preferably within the range of about $1\times10^{16}$ to about $1\times10^{17}$ atoms per cm$^3$, and mast preferably is about $4\times10^{16}$ atoms per cm$^3$. At the bottom of the shallow retrograde p-well 180, chat is, at depth $D_3$ (FIG. 13c), the dopant concentration $C_3max$ (FIG. 13c) is within the range of about $2\times10^{16}$ to about $1\times10^{18}$ atoms per cm$^3$, and is preferably within the range of about $2\times10^{16}$ to about $1\times10^{18}$ atoms per cm$^3$, and most preferably is about $1\times10^{17}$ atoms per cm$^3$. The single deep retrograde p-well 160 spans only red pixel cell 152 (FIG. 12) of the color pixel cell group 100 (FIG. 12). The single shallow retrograde p-well 180 spans only green pixel cell 156 (FIG. 12) of the color pixel cell group 100, as depicted in FIG. 12.

The three red, blue and green pixel cells 152, 154 and 156 form a color pixel cell group 100, as schematically represented in FIG. 12. Each of the red blue and green pixel cells 152, 154 and 156 includes a reset transistor 131a, 131b and 131c, respectively, and a charge transfer transistor 129a, 129b and 129c. Each cell is also associated with two additional n-channel transistors: a source-follower transistor 136a, 136b, and 136c, and a row select transistor 138a, 138b and 133c, respectively. As shown in FIG. 12, the reset transistor 131a of the red pixel cell 152 is formed by reset gate 132a and n+ regions 130a and 134a, which are fanned within the deep retrograde p-well 160. Similarly, the reset transistor 131b of the blue pixel cell 154 (FIG. 12) is formed by reset gate 132b and n+ regions 130b and 134b, which age formed within the shallow p-well 170. The reset transistor 131c of the green pixel cell 156 (FIG. 12) is formed by reset gate 132c and n+ regions 130c and 134c, which are formed within the shallow retrograde p-well 180. Likewise, the charge transfer transistor 129a of the red pixel cell 152 is formed by charge transfer gate 128a and n+ regions 126a and 130a, which are formed within the deep retrograde p-well 160. The charge transfer transistor 129b of the blue pixel cell 154 is formed by charge transfer gate 128b and n+ regions 126b and 130b, which are formed within the shallow p-well 170. The charge transfer transistor 129c of the green pixel cell 156 is formed by charge transfer gate 128c and n+ regions 126c and 130c, which are formed within the shallow p-well 170. The concentrations of boron implants as a function of the implantation depth for each of the deep retrograde p-well 160, the shallow p-well 170, and the shallow p-well 170, respectively, are schematically illustrated in FIGS. 13a–13c.

FIG. 14 illustrates a cross-sectional view of the middle portion of the color pixel cell 100 (FIG. 12), depicting only the blue pixel cell 154 which is built in the second shallow p-well 170. As shown in FIG. 14, the transistor gates forming the blue pixel cell 154 are a transfer gate 128b for a transfer transistor 129b and a reset transistor gate 132b for the reset transistor 131b. A photosensing area 126b may also be formed as a photodiode or a photogate 124 structure and including an associated color filter 155. Although the photosensitive element in the blue pixel cell 154 is shown as the photogate 124, other photosensitive elements, such as a photodiode or a photoconductor, could be used also, as desired. The source follower transistor 136b and the row select transistor 138b are shown only schematically in FIG. 14.

The transfer gate 128b and the reset gate 132b include a gate oxide layer 106 formed over the shallow p-well 170, and a conductive layer 108 of doped polysilicon, tungsten, or other suitable material, over the gate oxide layer 106. An insulating cap layer 110 of silicon dioxide, silicon nitride or ONO (oxide-nitride-oxide), for example, may be formed if desired. Alternatively, a more conductive layer, such as a silicide layer (not shown), may be formed between the conductive layer 108 and the cap 110 of the transfer gate stack 128b, source follower gate, row select gate, and reset gate stack 132b, if desired. Insulating sidewalls 112 are also formed on the sides of the gate stacks 128b, 132b. As known in the art, these insulating sidewalls may be formed of silicon dioxide, silicon nitride or ONO, for example. The transfer gate 128b is not required, but may advantageously be included. The photogate 124 is a semitransparent conductor and is shown in FIG. 14 as overlapping the n+ region 126b, which is formed within the shallow p-well 170.

A doped region 126b (FIG. 14) is a photosite for storing photogenerated charges which pass through the photogate 124. A doped region 130b is also formed in between the reset transistor gate 132b and the transfer gate 128b. The doped region 130b is the source for the reset transistor 131b. A doped region 134b that acts as a drain for the reset transistor 131b is also formed on the other side of the reset transistor gate 132b, as also illustrated in FIG. 14. The doped regions 126b, 130b, 134b are doped to a second conductivity type, which for exemplary purposes is treated as n-type. The second doped region 130b is the floating diffusion region, sometimes also referred to as a floating diffusion node, and it serves as the source for the reset transistor 131b. The third doped region 134b is the drain of the reset transistor 131b, and is also connected to voltage source Vdd.

Doped regions 126b, 130b, and 134b (FIG. 14) are formed in the shallow p-well 170, and are doped to a second conductivity type, which for exemplary purposes will be considered to be n-type. The doping level of the doped regions 126b, 130b, 134b may vary but should be higher than the doping level at the top of the shallow p-well 170. If desired, multiple masks and resists may be used to dope these regions to different levels. Doped region 126b may be variably doped, such as either (n+) or (n−) for an n-channel device. Doped region 134b should be strongly doped, for example, for an n-channel device, the doped region 134b will be doped as (n+). Doped region 130b is typically strongly doped (n+), and would not be lightly doped (n−) unless a buried contact is also used.

As shown in FIG. 14, as light radiation 12 in the form of blue photons (corresponding to the blue pixel cell 154) strikes the photosite 126b, photo-energy is converted to electrical signals, such as carriers 120, which are stored in the photosite 126b. The absorption of light creates electron-hole pairs. For the case of an n-doped photosite in a p-well, it is the electrons that are stored. For the case of a p-doped photosite in an n-well, it is the holes that are stored. In the exemplary blue pixel cell 154 having n-channel devices formed in the p-type shallow well 170, the carriers 120 stored in the photosite 126b are electrons. The shallow p-well 170 acts to reduce carrier loss to the substrate 16 by forming a concentration gradient that modifies the band diagram and serves to reflect electrons back towards the photosite 126, thereby increasing quantum efficiency of the blue pixel cell 154. Similarly, the deep retrograde p-well 160 increases the red response of the red pixel cell 152 (FIG. 12), while the shallow retrograde p-well 180 increases the green response of the green pixel cell 156 (FIG. 12) and decreases the red response.

Although in the exemplary embodiment described above, the first, second and third doped regions 160, 170 and 180 are formed in sequential steps, the invention is not limited to this embodiment. For example, a single pattern layer, preferably a photoresist mask, may be employed to simultaneously create three separate implantation regions over the semiconductor substrate 16. This way, p-type dopants may be implanted in the three separate implantation regions, either subsequently or simultaneously, to form, for example, the deep retrograde p-well 160, the second shallow p-well 170, and the shallow retrograde p-well 180.

Although only one color pixel cell group 100 is shown in FIG. 12 comprising only three color pixel cells 152, 154 and 156, it must be understood that in fact a plurality of color pixel cells group 100 may be formed on the semiconductor substrate 16. Also, although the color pixel cell group 100 of FIG. 12 comprises only three color pixel cells 152, 154 and 156, it must be understood that the present invention contemplates a color pixel cell with more than three color pixel cells, for example with four color pixel cells, each having a multiple graded doped region formed below.

Further, although the embodiment described above refers to the formation of multiple graded p-wells, such as the deep retrograde p-well 160, the second shallow p-well 170 or the shallow retrograde p-well 180, formed by implanting a p-type dopant, such as boron, for example, the invention is not limited to this embodiment. Thus, if only one or all of the multiple graded wells are to be an n-type well, an n-type dopant, such as arsenic, antimony, or phosphorous, will be implanted. Multiple high energy implants may be also used to tailor the profile of each of the deep retrograde p-well 160, the second shallow p-well 170 or the shallow retrograde p-well 180. Further, if peripheral circuitry is formed in the multiple graded doped regions, the multiple graded doped regions may have a different dopant profile in the peripheral region than in the array region.

Moreover, although the color pixel cell group 100 of FIG. 12 comprises three color pixel cells 152, 154 and 156, each having a multiple graded doped region formed below, it must be understood that the present invention also contemplates a pixel cell with any number of graded doped regions, for example with two multiple graded doped regions.

The color pixel cell group 100 (FIG. 12) is essentially complete at this stage, and conventional processing methods may be used to form contacts and wiring to connect gate lines and other connections in the color pixel cell group 100. For example, the entire surface may then be covered with a passivation layer of silicon dioxide, BSG, PSG, or BPSG, among others, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 15:
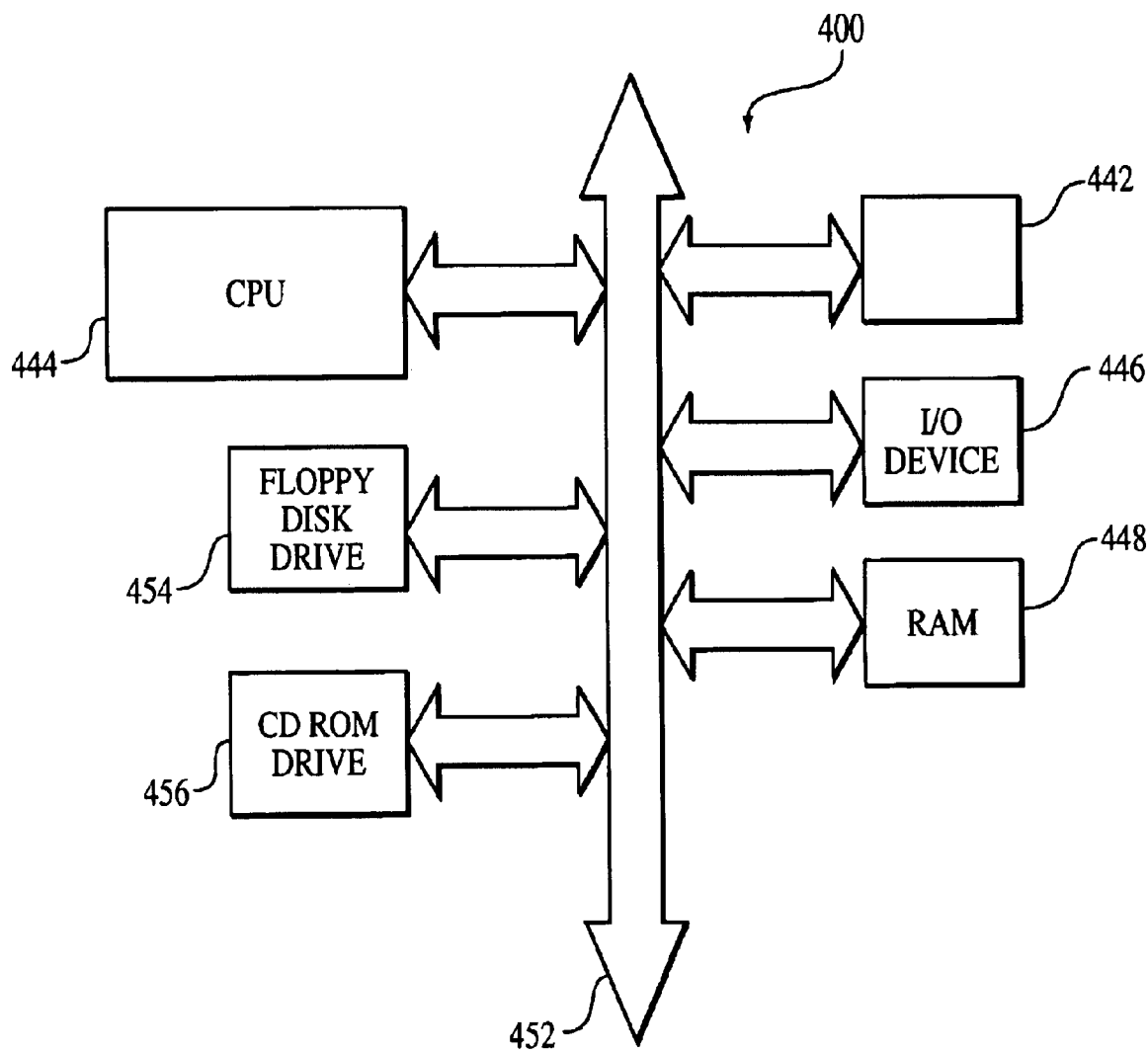
FIG. 15 is an illustration of a computer system having a CMOS imager with color pixels formed according to the present invention.

A typical processor based system which includes a CMOS imager device according to the present invention is illustrated generally at 400 in FIG. 15. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, for example, a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes color pixel cells containing a photosensor, such as a photogate or photodiode formed with multiple graded doped regions, as previously described with respect to FIGS. 5–14. The CMOS imager 442 may be combined with a processor, such as a CPU, digital signal processor or microprocessor, with or without memory storage in a single integrated circuit, or may be on a different chip than the processor.

It should again be noted that, although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A color pixel cell for an imaging device, said color pixel cell comprising:
    a first, second and third doped regions of a first conductivity type formed in a substrate, at least one of said first, second and third doped regions having a substantially different depth in said substrate from another doped region and being displaced laterally relative to said another doped region such that at least said one doped region does not overlap with said another doped region;

a first, second and third photosensitive regions formed in said respective first, second and third doped regions for receiving first, second and third photocharges corresponding to a particular color wavelength; and a first, second and third floating diffusion regions of a second conductivity type formed in said respective first, second and third doped regions for receiving said respective photocharges transferred from said respective first, second and third photosensitive regions.

2. The color pixel of claim 1 wherein at least two of said first, second, and third doped regions have a substantially different depth from each other.

3. The color pixel of claim 1 wherein all three of said first, second, and third doped regions have a substantially different depth from each other.

4. The color pixel cell of claim 1, wherein said first doped region, said first photosensitive region and said first floating diffusion region correspond to a red sensor cell of said imaging device.

5. The color pixel cell of claim 1 wherein at least one of said first, second, and third doped regions is a retrograde well.

6. The color pixel cell of claim 1 wherein at least two of said first, second, and third doped regions is a retrograde well.

7. The color pixel cell of claim 1 wherein said first, second, and third doped regions are for collecting charges for red, blue and green wavelengths respectively and said first and third doped regions are retrograde wells.

8. The color pixel cell of claim 7 wherein said second doped region is a non-retrograde well.

9. The color pixel cell of claim 7 wherein the doping concentration at the surface of said first doped region is within the range of about $5 \times 10^{14}$ to $1 \times 10^{18}$ atoms per $cm^3$.

10. The color pixel cell of claim 9 wherein the doping concentration at the surface of said first doped region is within the range of about $1 \times 10^{16}$ to about $1 \times 10^{17}$ atoms per $cm^3$.

11. The color pixel cell of claim 10 wherein the doping concentration at the surface of said first doped region is about $4 \times 10^{16}$ atoms per $cm^3$.

12. The color pixel cell of claim 7 wherein the doping concentration at the bottom of said first doped region is within a range of about $1 \times 10^{16}$ to about $2 \times 10^{18}$ atoms per $cm^3$.

13. The color pixel cell of claim 12 wherein the doping concentration at the bottom of said first doped region is within the range of about $2 \times 10^{16}$ to about $1 \times 10^{18}$ atoms per $cm^3$.

14. The color pixel cell of claim 13 wherein the doping concentration at the bottom of said first doped region is about $1 \times 10^{17}$ atoms per $cm^3$.

15. The color pixel cell of claim 7 wherein the doping concentration at the surface of the second doped region is within the range of about $5 \times 10^{18}$ to about $1 \times 10^{18}$ atoms per $cm^3$.

16. The color pixel cell of claim 15 wherein the doping concentration at the surface of said second doped region is within the range of about $1 \times 10^{16}$ to about $1 \times 10^{17}$ atoms per $cm^3$.

17. The color pixel cell of claim 16 wherein the doping concentration at the surface of said second doped region is about $4 \times 10^{16}$ atoms per $cm^3$.

18. The color pixel cell of claim 7 wherein the doping concentration at the surface of said third doped region is within the range of about $5 \times 10^{14}$ to about $1 \times 10^{18}$ atoms per $cm^3$.

19. The color pixel cell of claim 18 wherein the doping concentration at the surface of said third doped region is within the range of about $1 \times 10^{16}$ to about $1 \times 10^{17}$ atoms per $cm^3$.

20. The color pixel cell of claim 19 wherein the doping concentration at the surface of said third doped region is about $4 \times 10^{16}$ atoms per $cm^3$.

21. The color pixel cell of claim 20 wherein the doping concentration at the bottom of said third doped region is within a range of about $1 \times 10^{16}$ to about $2 \times 10^{18}$ atoms per $cm^3$.

22. The color pixel cell of claim 21 wherein the doping concentration at the bottom of said third doped region is within the range of about $2 \times 10^{16}$ to about $1 \times 10^{18}$ atoms per $cm^3$.

23. The color pixel cell of claim 22 wherein the doping concentration at the bottom of said third doped region is about $1 \times 10^{17}$ atoms per $cm^3$.

24. The color pixel cell of claim 1, wherein said second doped region, said second photosensitive region and said second floating diffusion region correspond to a blue sensor cell of said imaging device.

25. The color pixel cell of claim 1, wherein said third doped region, said third photosensitive region and said third floating diffusion region correspond to a green sensor cell of said imaging device.

26. The color pixel cell of claim 1, wherein said first conductivity type is p-type, and said second conductivity type is n-type.

27. The color pixel cell of claim 26, wherein said first doped region is for a red sensor cell and is a deep retrograde well of a first depth.

28. The color pixel cell of claim 27, wherein said second doped region is for a blue sensor cell and is a shallow well of a second depth.

29. The color pixel cell of claim 28, wherein said third doped region is for a green sensor cell and is a shallow retrograde well of a third depth.

30. The color pixel cell of claim 29, wherein said first depth is substantially greater than said second depth.

31. The color pixel cell of claim 30, wherein said first depth is substantially greater than said third depth.

32. The color pixel cell of claim 31, wherein said third depth is substantially greater than said second depth.

33. The color pixel cell of claim 1, wherein said first conductivity type is n-type, and said second conductivity type is p-type.

34. The color pixel cell of claim 1, wherein each of said respective first, second and third photosensitive regions farther comprises a respective photosensor for controlling the collection of charges in said photosensitive region.

35. The color pixel cell of claim 34, wherein each of said photosensor is a photodiode sensor.

36. The color pixel cell of claim 34, wherein each of said photosensor is a photogate sensor.

37. The color pixel cell of clam 34, wherein each of said photosensor is a photoconductor sensor.

38. The color pixel cell of claim 1, wherein at least two of said first second, and third doped regions are separated by an isolation region.

39. The color pixel of claim 1, wherein said first, second, and third doped regions are each separated by an isolation region.

40. A color pixel cell for an imaging device, said color pixel cell comprising:
- a red pixel cell, a blue pixel cell and a green pixel cell, each comprising a respective first, second and third multiple graded wells of a first conductivity type formed in a substrate, said first, second and third multiple graded wells having substantially different depths in said substrate and being displaced laterally such that said graded wells do not overlap;
- a photosensor formed in each one of said first, second and third multiple graded wells for sensing respective red, blue and green color wavelengths;
- a reset transistor having a gate stack formed in each one of said first, second and third multiple graded wells;
- a floating diffusion region of a second conductivity type formed in each one of said first, second and third multiple graded wells between said photosensor and said reset transistor for receiving charges from said photosensor, said reset transistor operating to periodically reset a charge level of said floating diffusion region; and
- an output transistor having a gate electrically connected to said floating diffusion region.

41. The color pixel cell of claim 40, wherein said first multiple graded well is a deep retrograde well of a first depth.

42. The color pixel cell of claim 41, wherein said deep retrograde well is a deep retrograde p-well.

43. The color pixel cell of claim 42, wherein said shallow retrograde well is a shallow retrograde p-well.

44. The color pixel cell of claim 42, wherein said first, second, and third multiple graded well are at respective first, second and third depths and said first depth is substantially greater than said second and third depths.

45. The color pixel cell of claim 44, wherein said third depth is substantially greater than said second depth.

46. The color pixel cell of claim 41, wherein said second multiple graded well is a shallow well of a second depth.

47. The color pixel cell of claim 40, wherein said shallow well is a shallow p-well.

48. The color pixel cell of claim 40, wherein said third multiple graded well is a shallow retrograde well of a third depth.

49. The color pixel cell of claim 40, wherein said photosensor further comprises a doped region of a second conductivity type located in each one of said first, second and third multiple graded wells.

50. The color pixel cell of claim 49, wherein said photosensor is a photodiode sensor.

51. The color pixel cell of claim 49, wherein said photosensor is a photoconductor sensor.

52. The color pixel cell of claim 40, further comprising a transfer gate located between said photosensor and said floating diffusion region in each of said wells.

53. The color pixel cell of claim 49, wherein said photosensor is a photogate sensor.

54. The color pixel cell of claim 40, wherein said first conductivity type is p-type, and said second conductivity type is n-type.

55. The color pixel cell of claim 40, wherein said first conductivity type is n-type, and said second conductivity type is p-type.

56. The color pixel cell of claim 40, wherein at least two of said first second, and third multiple graded wells are separated by an isolation region.

57. The color pixel cell of claim 40, wherein said first second, and third multiple graded wells are each separated by an isolation region.

58. A CMOS imager comprising:
- a substrate having a first, second and third multiple graded wells of a first conductivity type, said first, second and third multiple graded wells having substantially different depths in said substrate and being displaced laterally such that said multiple graded wells do not overlap, and wherein each of said first, second and third multiple graded wells has a respective photosensor formed therein for sensing respective red, blue and green color wavelengths;
- an array of pixel sensor cells formed in said first, second and third multiple graded wells; and
- a circuit electrically connected to receive and process output signals from said array.

59. The CMOS imager of claim 58, wherein said first multiple graded well is a deep retrograde well having a first depth.

60. The CMOS imager of claim 59, wherein said deep retrograde well is a deep retrograde p-well.

61. The CMOS imager of claim 59, wherein said second multiple graded well is a shallow well having a second depth.

62. The CMOS imager of claim 61, wherein said third multiple graded well is a shallow retrograde well having a third depth.

63. The CMOS imager of claim 62, wherein said shallow retrograde well is a shallow retrograde p-well.

64. The CMOS imager of claim 62, wherein said first depth is substantially greater than said second and third depths, and said third depth is substantially greater than said second depth.

65. The CMOS imager of claim 59, wherein said photosensor is a photogate sensor.

66. The CMOS imager of claim 59, wherein said photosensor is a photodiode sensor.

67. The CMOS imager of claim 59, wherein said photosensor is a photoconductor sensor.

68. The CMOS imager of claim 58, wherein said shallow well is a shallow p-well.

69. The CMOS imager of claim 58, wherein each pixel sensor cell comprises a floating diffusion region of a second conductivity type located in each of said first, second and third multiple graded wells.

70. The CMOS imager of claim 69, wherein said first conductivity type is p-type, and said second conductivity type is n-type.

71. The CMOS imager of claim 69, wherein said first conductivity type is n-type, and said second conductivity type is p-type.

72. The CMOS imager of claim 69, wherein each pixel sensor cell further comprises a transfer gate located between said photosensor and said floating diffusion region.

73. The CMOS imager of claim 58, wherein at least two of said first second, and third multiple graded wells are separated by an isolation region.

74. The CMOS imager of claim 58, wherein said first second, and third multiple graded wells are each separated by an isolation region.

75. An imager comprising:
- an array of color pixel cells formed in a substrate having at least one deep retrograde well of a first conductivity type, at least one shallow well of said first conductivity type, and at least one shallow retrograde well of said first conductivity type, wherein each pixel sensor cell has a photosensor for sensing a respective particular color wavelength, and wherein said deep retrograde well, said shallow well and said shallow retrograde well have substantially different depths and are displaced laterally such that said wells do not overlap;
a circuit formed in the substrate and electrically connected to the array for receiving and processing signals representing an image output by the array and for providing output data representing the image; and
a processor for receiving and processing data representing the image.

76. The imager of claim 75, wherein said array, said circuit, and said processor are formed on a single substrate.

77. The imager of claim 75, wherein said array and said circuit are formed on a first substrate, and said processor is formed on a second substrate.

78. The imager of claim 75, wherein said at least one deep retrograde well has a depth substantially greater than the depths of said at least one shallow well and said at least one shallow retrograde well.

79. The imager of claim 75, wherein each pixel sensor cell further comprises a floating diffusion region of a second conductivity type located in each one of said at least one deep retrograde well, at least one shallow well and at least one shallow retrograde well.

80. The imager of claim 79, wherein said first conductivity type is p-type, and said second conductivity type is n-type.

81. The imager of claim 79, wherein said first conductivity type is n-type, and said second conductivity type is p-type.

82. The imager of claim 79, wherein each pixel sensor cell further comprises a transfer gate located between said photosensor and said floating diffusion region.

83. The imager of claim 82, wherein said photosensor is a photogate sensor.

84. The imager of claim 82, wherein said photosensor is a photodiode sensor.

85. The imager of claim 82, wherein said photosensor is a photoconductor sensor.

86. The imager of claim 75, wherein at least two of said deep retrograde well, shallow well, and shallow retrograde well are separated by an isolation region.

87. The imager of claim 75, wherein said deep retrograde well, shallow well, and shallow retrograde well are each separated by an isolation region.

88. A color pixel cell for an imaging device, said color pixel cell comprising:
at least two doped regions of a first conductivity type formed in a substrate, said at least two doped regions having substantially different depths in said substrate and being displaced laterally such that said doped regions do not overlap;
at least two photosensitive regions respectively formed in said at least two doped regions for respectively receiving photocharges corresponding to a particular color wavelength; and
at least two floating diffusion regions of a second conductivity type formed in said respective at least two doped regions for receiving said respective photocharges transferred from said respective at least two photosensitive regions.

89. The color pixel cell of claim 88, wherein each of said at least two doped regions, of said at least two photosensitive regions and of said at least two floating diffusion regions correspond to a particular color sensor cell of said imaging device.

90. The color pixel cell of claim 88, wherein said first conductivity type is p-type, and said second conductivity type is n-type.

91. The color pixel cell of claim 88, wherein said first conductivity type is n-type, and said second conductivity type is p-type.

92. The color pixel cell of claim 88, wherein one of said at least two doped regions is a deep retrograde well.

93. The color pixel cell of claim 88, wherein one of said at least two doped regions is a shallow well.

94. The color pixel cell of claim 88, wherein one of said at least two doped regions is a shallow retrograde well.

95. The color pixel cell of claim 88, wherein each of said respective at least two photosensitive regions further comprises a respective photosensor for controlling the collection of charges in said photosensitive region.

96. The color pixel cell of claim 95, wherein each of said photosensor is a photodiode sensor.

97. The color pixel cell of claim 95, wherein each of said photosensor is a photogate sensor.

98. The color pixel cell of clam 95, wherein each of said photosensor is a photoconductor sensor.

99. The color pixel cell of claim 88, wherein at least two of said first second, and third doped regions are separated by an isolation region.

100. The color pixel cell of claim 88, wherein said first, second, and third doped regions are each separated by an isolation region.

101. A color imaging sensor comprising:
a substrate having a first defined region for sensing a first color wavelength component;
a second defined region for sensing a second color wavelength component;
a third defined region for sensing a third color wavelength component, wherein the lower boundaries of each of said first, second and third defined regions are located at respective different depths from a surface of said substrate and are displaced laterally such that said defined regions do not overlap, and wherein at least one of said regions is a retrograde well doped to a first conductivity type; and
a photosensor formed in each one of said first, second and third defined regions.

102. The color imaging sensor of claim 101, wherein the lower boundary of each of said first, second and third defined regions corresponds to the depth of penetration of a respective color wavelength component into said substrate.

103. The color imaging sensor of claim 102, wherein said first, second and third color wavelength components are red, blue and green, respectively.

104. The color imaging sensor of claim 102, wherein at least two of said first, second and third defined regions have a substantially different depth from each other.

105. The color imaging sensor of claim 102, wherein all three of said first, second and third defined regions have a substantially different depth from each other.

106. The color imaging sensor of claim 105, wherein said first depth is substantially greater than said second depth.

107. The color imaging sensor of claim 105, wherein said first depth is substantially greater than said third depth.

108. The color imaging sensor of claim 105, wherein said third depth is substantially greater than said second depth.

109. The color imaging sensor of claim 101, wherein at least two of said first, second, and third defined regions are separated by an isolation region.

110. The color imaging sensor of claim 101, wherein said first, second, and third defined regions are each separated by an isolation region.

* * * * *

UNITED STATES PATENT AND TRADEMARK OFFICE
CERTIFICATE OF CORRECTION

PATENT NO. : 6,756,616 B2
DATED : June 29, 2004
INVENTOR(S) : Howard E. Rhodes

It is certified that error appears in the above-identified patent and that said Letters Patent is hereby corrected as shown below:

Column 6,
Line 8, "a" should read -- an --;

Column 9,
Line 58, "fanned" should read -- formed --;
Line 61, "age" should read -- are --.

Signed and Sealed this

First Day of February, 2005

JON W. DUDAS
*Director of the United States Patent and Trademark Office*